United States Patent
Kobayashi et al.

(10) Patent No.: US 8,304,664 B2
(45) Date of Patent: Nov. 6, 2012

(54) ELECTRONIC COMPONENT MOUNTED STRUCTURE

(75) Inventors: Tsuyoshi Kobayashi, Nagano (JP); Michio Horiuchi, Nagano (JP); Yukio Shimizu, Nagano (JP); Yasue Tokutake, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 88 days.

(21) Appl. No.: 12/777,605

(22) Filed: May 11, 2010

(65) Prior Publication Data

US 2010/0294552 A1    Nov. 25, 2010

(30) Foreign Application Priority Data

May 19, 2009   (JP) .................................. 2009-120634

(51) Int. Cl.
    *H05K 1/11*    (2006.01)
(52) U.S. Cl. ........................ 174/261; 174/259
(58) Field of Classification Search .................. 174/259, 174/261
    See application file for complete search history.

(56) References Cited

U.S. PATENT DOCUMENTS

| | | |
|---|---|---|
| 4,463,084 A | 7/1984 | Mitsumori |
| 6,501,169 B1 | 12/2002 | Aoki et al. |
| 7,115,238 B2 | 10/2006 | Higuchi |
| 7,605,474 B2 * | 10/2009 | Uang et al. .................. 257/773 |
| 2008/0284042 A1 | 11/2008 | Hotta et al. |
| 2012/0055799 A1 | 3/2012 | Hotta et al. |

FOREIGN PATENT DOCUMENTS

| | | |
|---|---|---|
| JP | 58-137915 | 8/1983 |
| JP | 58-141595 | 8/1983 |
| JP | 62-234804 | 10/1987 |
| JP | 4-296036 | 10/1992 |
| JP | 2000-243147 | 9/2000 |
| JP | 2001-156209 | 6/2001 |
| JP | 2002-151551 A1 | 5/2002 |
| JP | 2002-261455 | 9/2002 |
| JP | 2004-273480 A1 | 9/2004 |
| JP | 2008-270158 | 11/2008 |
| JP | 2009-147241 A1 | 7/2009 |

OTHER PUBLICATIONS

Japanese Office Action mailed Aug. 14, 2012, with English Translation in counterpart Japanese Application No. 2009-120634.

* cited by examiner

*Primary Examiner* — Jeremy Norris
(74) *Attorney, Agent, or Firm* — Kratz, Quintos & Hanson, LLP

(57) ABSTRACT

An electronic component (chip) mounted structure includes a chip having a terminal, a wiring board having a terminal electrically connected to the terminal of the chip, and an interposing board disposed between the chip and the wiring board and having a structure including an insulating base material provided with a large number of filamentous conductors penetrating the insulating base material in a thickness direction thereof. The terminal of the chip is electrically connected to the terminal of the wiring board via a plurality of filamentous conductors provided in the interposing board.

8 Claims, 7 Drawing Sheets

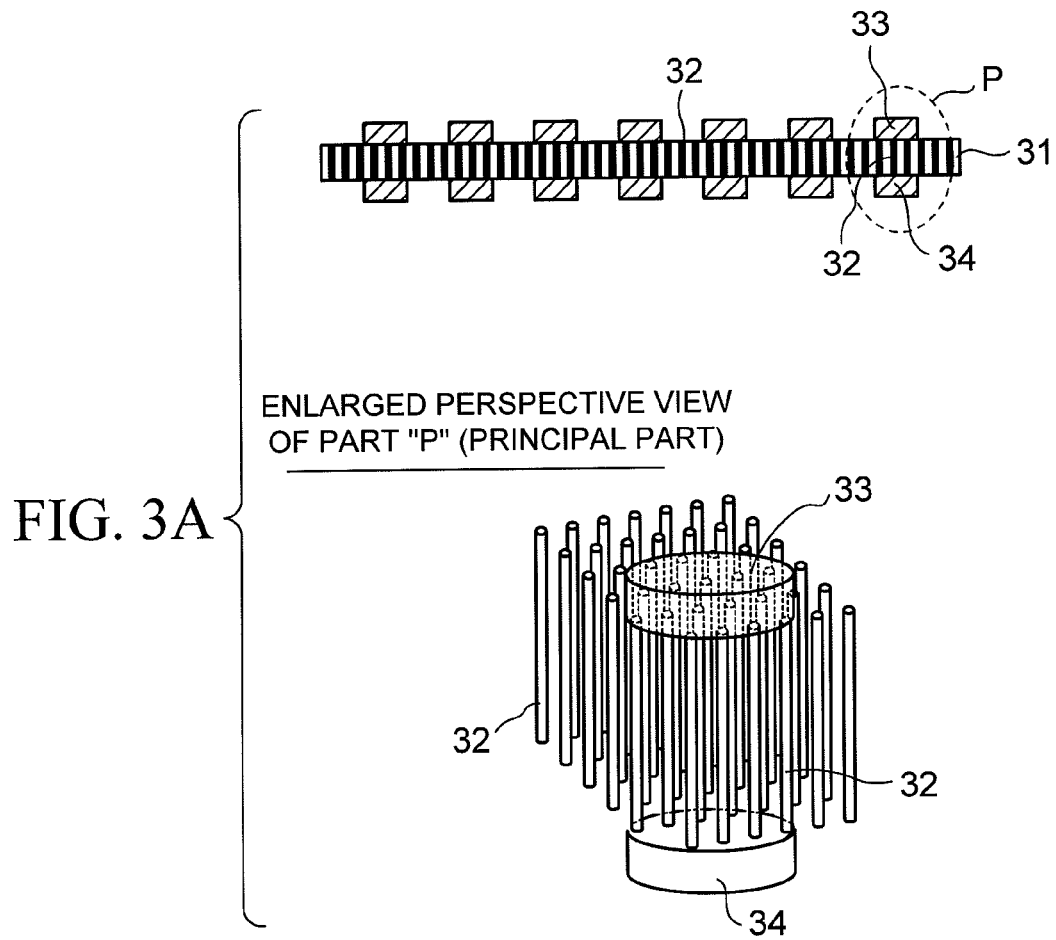
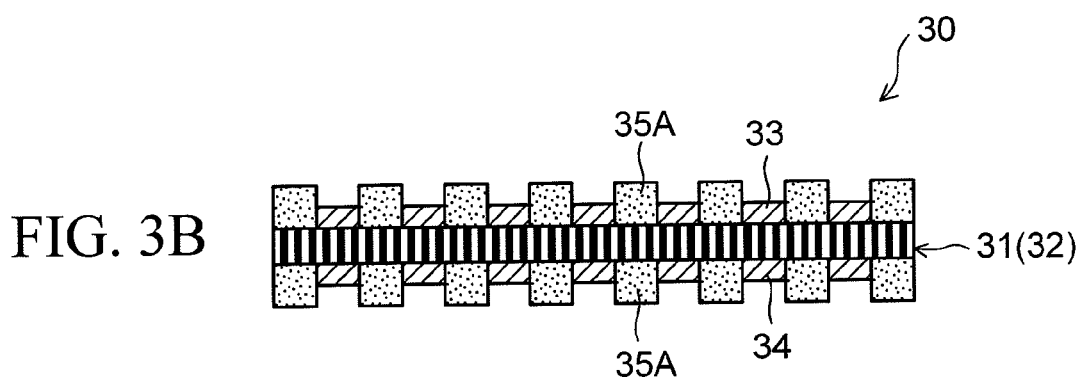

ELECTRONIC COMPONENT MOUNTED STRUCTURE

CROSS-REFERENCE TO RELATED APPLICATIONS

This application is based on and claims priority of Japanese Patent Application No. 2009-120634 filed on May 19, 2009, the entire contents of which are incorporated herein by reference.

BACKGROUND OF THE INVENTION (a) Field of the Invention

The present invention relates to a technology for mounting an electronic component such as a semiconductor element or the like on a wiring board. More particularly, it relates to an electronic component mounted structure in which a board serving as an interposer is interposed between a wiring board and an electronic component mounted thereon.

In such a mounted structure, the wiring board plays a role in mounting of an electronic component such as a semiconductor element or the like, and thus is also referred to as a "semiconductor package" or simply a "package" for convenience in the description below.

(b) Description of the Related Art

Flip chip bonding is one of methods for mounting an electronic component (chip) such as a semiconductor element on the surface of a wiring board (package). In mounting by the flip chip bonding, a chip and a package are electrically connected to each other by being bonded together with bumps interposed therebetween. Specifically, the bumps are formed on both of the chip side and the package side using the same metal material or different metal materials. Alternatively, metal bumps are formed on the chip side alone. An example of the bonding with the same metal includes bonding between a solder bump and another solder bump. Examples of the bonding with different metals include bonding between a copper (Cu) bump and a solder bump, bonding between a gold (Au) bump and a solder bump, and the like.

In any form of the bonding, the electrical connection between the chip and the package is achieved using at least a solder bump therebetween. Materials usable for the solder bump include a eutectic solder and a lead-free solder. The eutectic solder has a tin (Sn)-lead (Pb) composition. The lead-free solder is represented by Sn-silver (Ag) based solder, Sn—Cu based solder, Sn-zinc (Zn) based solder, or the like. Any of the solder materials contains tin (Sn) as the principal metal.

The description is continued taking a specific mounted structure as an example. A package is provided with a solder material (bump) formed on a pad (for example, a conductor layer made of copper (Cu)/nickel (Ni)/gold (Au)) exposed from the outermost insulating layer (typically, a solder resist layer) on the chip mounting surface side of the package. A chip to be mounted is provided with a projecting terminal (for example, Cu bump) formed on an electrode pad exposed from a protection film on the chip. The projecting terminal is brought into contact with the solder bump of the package. The solder bump is melted by reflowing, and thus the chip is electrically connected to the package (flip chip mounting). Further, an underfill resin (thermosetting resin) is filled into a gap between the mounted chip and the package, and is thermally cured to fix the chip on the package.

As an example of technique related to the above-mentioned prior art, Japanese unexamined Patent Publication (Kokai) 2002-151551 discloses a flip chip mounting structure. This flip chip mounting structure includes a semiconductor chip having an electrode and a noble metal (Au) bump formed on the electrode, and a wiring board having a surface provided with a connection terminal (Cu or the like). A thermosetting resin sheet is inserted between the semiconductor chip and the wiring board. Then, the resultant structure is pressed and heated while receiving ultrasonic vibration application. Thereby, the noble metal bump is connected to the connection terminal by metal bonding, and the chip is fixed to the wiring board with the thermally cured resin.

In the above-described conventional mounting technique by the flip chip bonding, the electrical connection between the chip and the package is achieved with the solder bump which contains at least tin (Sn) as the principal metal. This causes the following problems at the time of use (at the time of conducting a current) after the chip is mounted on the package.

Specifically, electromigration is easy to occur due to a current passing through a connection portion between the chip and the package, as the pitch between the terminals is further reduced because of miniaturization of packages and chips, higher integration (microfabrication) of wiring patterns, and the like. As a result, a void is produced in a portion of the connection portion, which increases the electrical resistance and reduces the bonding strength at the portion. In some cases, a breakage is caused at the portion (open circuit). Particularly, the electromigration occurs more remarkably where solder (alloy containing Sn) which is one of low-melting-point metals that readily cause electromigration is interposed between the chip and the package.

Namely, at the time of use (at the time of conducting a current) after the chip is mounted on the package, an electromigration phenomenon occurs between the solder (alloy containing Sn) which is the bump material, and a metal (Au, Ni, Cu, or the like) for the terminal. The phenomenon accumulatively causes problems such as an increase in the electrical resistance, an open circuit or the like at the connection portion, and thus lowers a reliability in the connection.

SUMMARY OF THE INVENTION

An object of the present invention is to provide an electronic component mounted structure which substantially eliminates problems such as an increase in the electrical resistance, an open circuit or the like, due to electromigration at the connection portion at the time of use (at the time of conducting a current) after an electronic component is mounted on a wiring board, and which consequently contributes to an improvement in the reliability of connection.

According to the invention, there is provided an electronic component mounted structure including: an electronic component having a terminal; a wiring board having a terminal electrically connected to the terminal of the electronic component; and an interposing board disposed between the electronic component and the wiring board and having a structure including an insulating base material provided with a large number of filamentous conductors penetrating the insulating base material in a thickness direction thereof, in which the terminal of the electronic component is electrically connected to the terminal of the wiring board via a plurality of filamentous conductors in the interposing board.

In a conventional structure, a chip (electronic component) and a package (wiring board) are connected to each other with a solder bump interposed between a terminal of the chip and a corresponding terminal (pad) on the package. In contrast, in the electronic component mounted structure according to the present invention, the electronic component and the wiring board are connected to each other with the plurality of filamentous conductors interposed between the terminal of the electronic component and the corresponding terminal on the wiring board. Namely, the electronic component is mounted on the wiring board without solder which is one of low-melting-point metals and which readily causes electromigration.

According to this structure, it is possible to substantially eliminates problems such as encountered in the prior art (an increase in the electrical resistance, an open circuit or the like, due to electromigration at the connection portion between the chip and the board) at the time of use after the mounting (at the time of conducting a current). This contributes to an improvement in the reliability of connection between the electronic component and the wiring board.

BRIEF DESCRIPTION OF THE DRAWINGS

FIGS. 3A and 3B are sectional views (including a perspective view) showing steps following the manufacturing steps shown in FIGS. 2A to 2E;

DESCRIPTION OF THE PREFERRED EMBODIMENTS

Description is given below with regard to preferred embodiments of the present invention with reference to the accompanying drawings.

Figure 1:
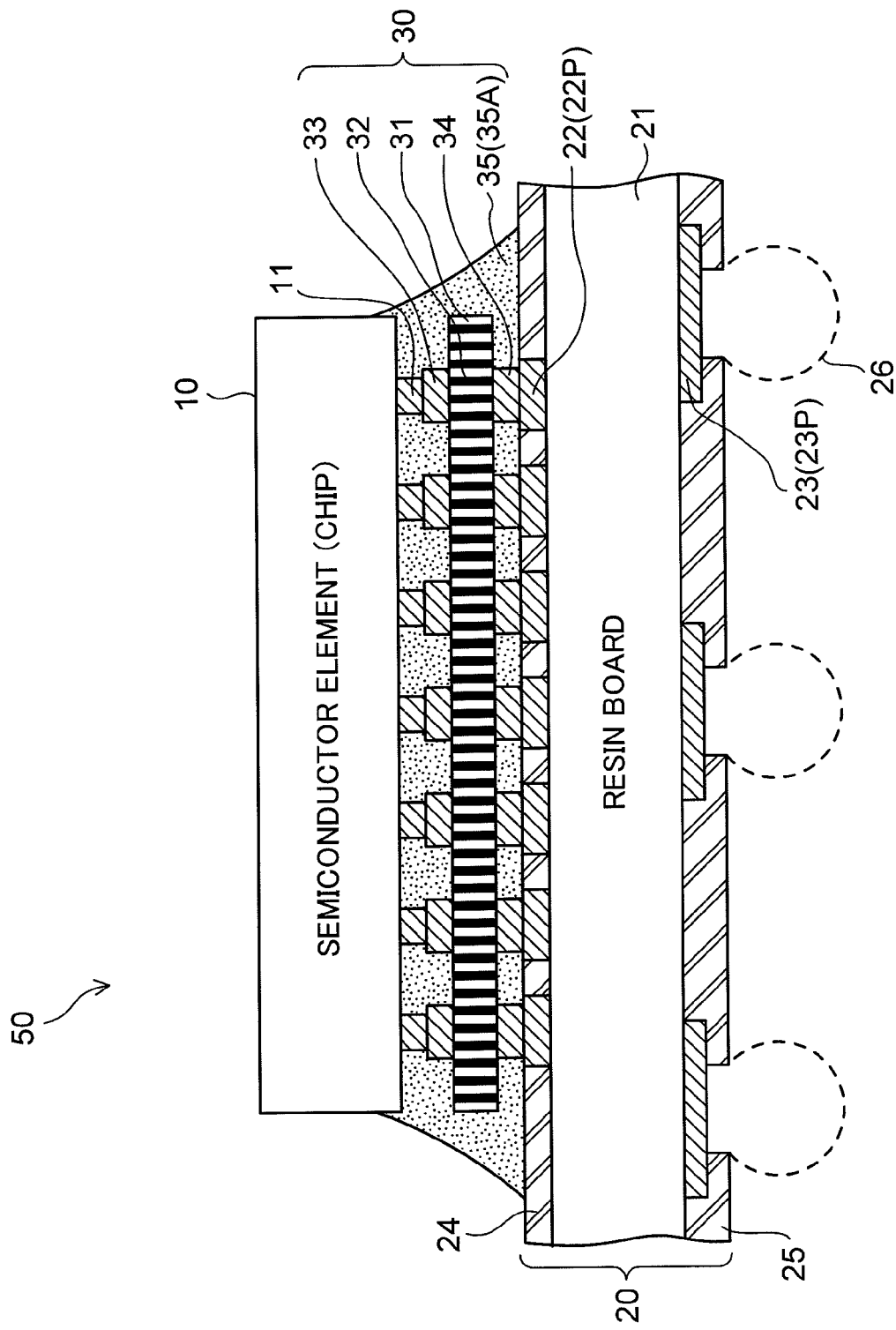
FIG. 1 is a sectional view showing an electronic component mounted structure according to an embodiment of the present invention.
Figure 2A:
FIGS. 2A to 2E are sectional views showing an example of manufacturing steps for a board for interposer used in the electronic component mounted structure in FIG. 1.
Figure 2B:
Figure 2C:
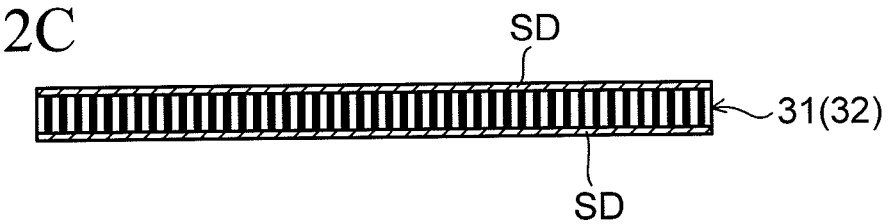
Figure 2D:
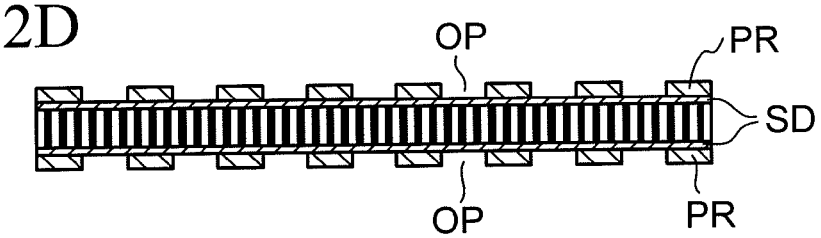
Figure 2E:
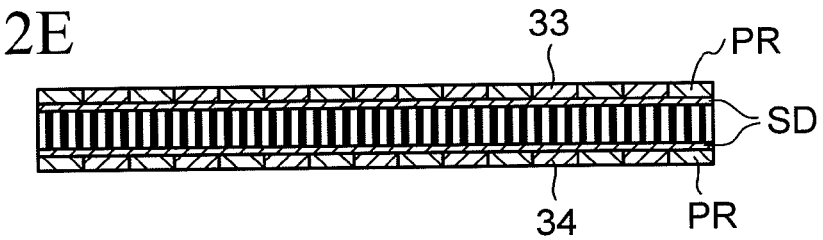

FIG. 1 shows a sectional view of an electronic component mounted structure according to an embodiment of the present invention.

The electronic component mounted structure 50 according to the present embodiment basically includes a semiconductor element (chip) 10 as an electronic component to be mounted, a wiring board (package) 20 for mounting the semiconductor element (chip) 10, and a board 30 interposed between the chip 10 and the package 20 and serving as an interposer for electrically connecting and mechanically bonding the two. Namely, the electronic component mounted structure 50 of this embodiment constitutes a semiconductor device. The board 30 interposed between the chip 10 and the package 20 is a member characterizing the invention, and is referred to as a "board for interposer" for the convenience of distinguishing the board 30 from the wiring board 20 in the description below.

The semiconductor element (chip) 10 to be mounted can be prepared by adopting a process for wafer-level packaging using a silicon (Si) wafer as described later. In this process, the chip 10 is obtained by dividing (dicing) a wafer into device units eventually. Projecting terminals (bumps) 11 are arranged in an area array pattern across the entire surface of the chip 10 on a side (the lower side in the illustrated example) where the device (integrated circuit) is formed. In this embodiment, the area array pattern is taken as an example of the terminal arrangement, but it is of course that the terminal arrangement is not limited thereto. For example, the terminals 11 may be arranged in a peripheral pattern in which the terminals 11 are arranged along the peripheral region on the chip face surface (circuit formation surface) side.

The wiring board (package) 20, as illustrated, includes a resin board 21 constituting the board body, wiring layers 22 and 23 formed in desired shapes by patterning on the respective surfaces of the resin board 21, and insulating layers 24 and 25 as protection films formed to cover the respective surfaces but to expose pads 22P and 23P from the surfaces. The pads 22P and 23P are defined at desired positions of the wiring layers 22 and 23, respectively. Note, the pads 22P on the chip mounting surface side are formed in such a manner that the exposed surfaces thereof are positioned on the same plane as the surface of the insulating layer 24. Copper (Cu) is typically used as the material for the wiring layers 22 and 23, and an epoxy-based resin is typically used as the material for the insulating layers 24 and 25.

Any board may constitute the resin board 21, as long as the board includes wiring layers formed at least on the outermost layers of the board, the wiring layers being electrically connected to each other through the inside of the board. The wiring layer may or may not be formed within the resin board 21.

In the present embodiment, to the pads 22P exposed from the insulating layer 24 on the chip mounting surface side, the terminals 11 of the semiconductor chip 10 are electrically connected through the board for interposer 30 as described later. On the other hand, to the pads 23P exposed from the insulating layer 25 on the side opposite to the chip mounting surface side, external connection terminals such as metal pins and solder balls 26 (each shown by a broken line in the drawing) used when the package 20 is mounted on a motherboard or the like, are bonded. Such external connection terminals may be provided when the package is delivered. Alternatively, the pads 23P may be left exposed so that the external connection terminals can be bonded at a later time when necessary. In this case, the surface of the pad 23P is treated by nickel (Ni)/gold (Au) plating or the like.

The basic configuration of the board for interposer 30 characterizing the invention is as follows. The board for interposer 30 has a structure including an insulating base material 31 having a desired thickness and filamentous conductors 32 having a small diameter. The filamentous conductors 32 are densely provided in the insulating base material 31 at predetermined intervals, penetrating the insulating base material 31 in a thickness direction thereof. Each of the filamentous conductors 32 is specifically formed in such a manner that both ends of the filamentous conductor 32 are exposed from the respective surfaces of the insulating base material 31. Furthermore, a pair of pads 33 and 34 each made of a conductor layer are formed on the respective surfaces of the insulating base material 31 in such a manner that the pair of pads 33 and 34 share a plurality of filamentous conductors 32 (see FIG. 3A). Namely, the pad 33 is electrically connected to one ends of the plurality of filamentous conductors 32 exposed from both of the surfaces of the insulating base material 31, while the pad 34 is electrically connected to the other ends thereof.

The pads 33 and 34 are connected to the corresponding filamentous conductors 32 provided in the insulating base material 31 and penetrating the insulating base material 31 in the thickness direction thereof as described above. The filamentous conductors 32 are further electrically connected to the terminals 11 of the chip 10 and the terminals (pads) 22P of the wiring board 20 via the pads 33 and 34, respectively. Each of the filamentous conductors 32 is also referred to as a "via" for convenience in the description below because the filamentous conductor 32 provides the electrical connection between both surfaces of the board therethrough.

The via (filamentous conductor) 32 is formed by filling a metal material in a through-hole formed in the insulating base material 31 as described later. The role of the via 32 is to surely receive a signal at one end thereof and transmit the signal to the other end side. For this reason, it is desirable that, when a certain region on the insulating base material 31 is selected as a connection portion for the signal at the time of designing, any region thus selected include a large number of the vias 32 on average.

Accordingly, the metal filling density in the insulating base material 31 needs to be as high as possible. To this end, the vias 32 having a small diameter are densely provided as described above. In this embodiment, the vias 32 are provided in such a manner that a distance "D" between the adjacent vias 32 is smaller than a diameter "d" of the via 32 (D<d). Further preferably, the diameter "d" of the via 32 is selected to be approximately 30 nm to 1 µm. The arrangement of the vias 32 is not particularly limited as long as the condition of D<d is satisfied. For example, the vias 32 may be arranged in a hexagonal pattern or in a grid pattern.

The pads 33 and 34 formed on the respective surfaces of the insulating base material 31 are connected to each other so as to share the plurality of vias 32. In this respect, when the diameter of each pad is selected to be, for example, approximately 90 to 100 µm, the pads are connected through several thousands of the vias 32.

Since the vias 32 are densely provided as described above, the distance between the adjacent pads 33 (or 34) needs to be selected in such a manner that it is larger than at least the diameter "d" of the via 32. The reason is as follows. Specifically, the distance between the adjacent pads 33 (or 34) can be made unlimitedly short; however, where a pad 33 (or 34) comes close to its adjacent pad 33 (or 34) beyond a certain distance, the pad 33 (or 34) may come into contact with the via 32 positioned on the periphery of its adjacent pad 33 (or 34) (i.e., the via 32 which is not completely covered with the adjacent pad, but partially outside the adjacent pad). Such a state can occur because the metal filling density is high.

Additionally, the coefficient of thermal expansion (CTE) of the semiconductor element (chip) 10 is largely different from the CTE of the wiring board (package) 20 disposed below the semiconductor element (chip) 10 with the board for interposer 30 interposed therebetween. Accordingly, it is desirable that the board for interposer 30 has a function of relaxing a stress attributable to the difference in CTE (the stress may warp the package 20). To this end, a material having a CTE intermediate between the CTE of the chip 10 and the CTE of the wiring board 20 is selected as the material for the board for interposer 30 (specifically, the insulating base material 31). Namely, the CTE of the board for interposer 30 is selected to be higher than the CTE of the chip 10 to be mounted, and to be lower than the CTE of the wiring board 20.

In this embodiment, the chip 10 to be mounted is formed of silicon (the CTE is approximately 3 ppm/° C.), and the wiring board 20 includes the wiring layers 22 and 23 made of copper (the CTE is approximately 16 to 17 ppm/° C.). Accordingly, ceramics such as alumina (the CTE is approximately 6 to 7 ppm/° C.), or mullite (the CTE is approximately 4.5 ppm/° C.) or the like, can be used as the material for the insulating base material 31. Mullite is preferably used from the viewpoint of transmitting a signal at a higher speed because the permittivity thereof is lower than that of alumina (the permittivity of alumina is approximately 8 to 10, while the permittivity of mullite is 6.5).

Additionally, spaces between the chip 10 and the board for interposer 30 as well as between the package 20 and the board for interposer 30 other than connection portions (ones between the terminals 11 and the pads 33 and ones between the terminals 22P and the pads 34) are filled with an underfill resin 35. The underfill resin 35 is formed by melting and curing uncured adhesive layers 35A which are formed on the respective surfaces of the board 30 as described later. A shrinkable resin is used as the underfill resin 35, and typically a thermosetting resin represented by an epoxy-based resin or the like is used.

In this embodiment, the terminals 11 of the chip 10 and the terminals (pads) 22P of the wiring board 20 are electrically connected to the corresponding pads 33 and 34 on the board for interposer 30, but the connection is made merely by contact. For this reason, the volume shrinkability of the underfill resin 35 (the adhesive layer 35A) at the time of thermal curing is utilized to fix the terminals 11, 22P and the pads 33, 34 in the contact state. Thereby, the electrical connections of the board 30 to the chip 10 and to the package 20 are stabilized. This contributes to stabilization of the electrical resistances at the connection portions between the terminals 11 and the pads 33 as well as at the connection portions between the terminals (pads) 22P and the pads 34, at the time of use after the mounting (at the time of conducting a current).

Note that, when appropriate, the underfill resin 35 is mixed with an inorganic filler (for example, amorphous silica) for adjusting the coefficient of thermal expansion (CTE). Since the CTE of this silica is as low as 0.5 ppm/° C., the inorganic filler contributes to a lowering in the CTE of the board for interposer 30 as a whole. Namely, the inorganic filler is mixed because the board for interposer 30 surely needs to have a CTE intermediate between those of the chip 10 and the package 20 as described above. Incidentally, alumina, silicon nitride, aluminum nitride, or the like can be used as the inorganic filler instead of silica.

The electronic component mounted structure (semiconductor device) 50 according to the present embodiment is characterized by the following. Namely, the board for interposer 30 is interposed between the semiconductor chip 10 to be mounted and the wiring board (package) 20. The filamentous conductors (vias) 32 are densely provided in the insulating base material 31 of the board 30, penetrating the insulating base material 31 in the thickness direction thereof. The pads 33 and 34 are connected to the respective end surfaces of the plurality of vias 32 in such a manner that the pair of pads 33 and 34 share the plurality of vias 32 (see FIGS. 3A and 3B). The terminals 11 of the chip 10 are electrically connected to the terminals (pads) 22P of the package 20 through the pads 33 and 34 (the plurality of vias 32). Concrete materials, sizes and the like of the board for interposer 30 and other constituent members are described in relation to the process to be described below.

Figure 4A:
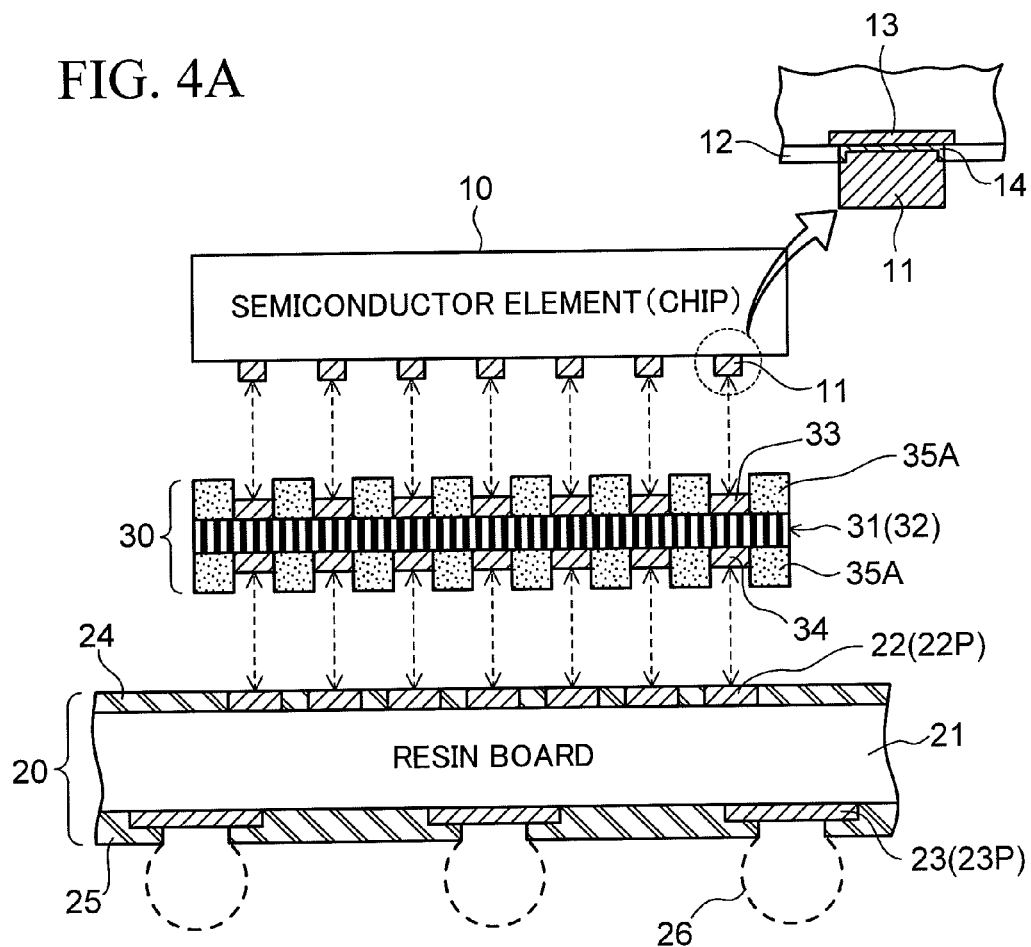
FIGS. 4A and 4B are sectional views showing steps in which an electronic component (semiconductor element) is mounted on a wiring board (package) using the board for interposer manufactured through the steps shown in FIGS. 3A and 3B.
Figure 4B:
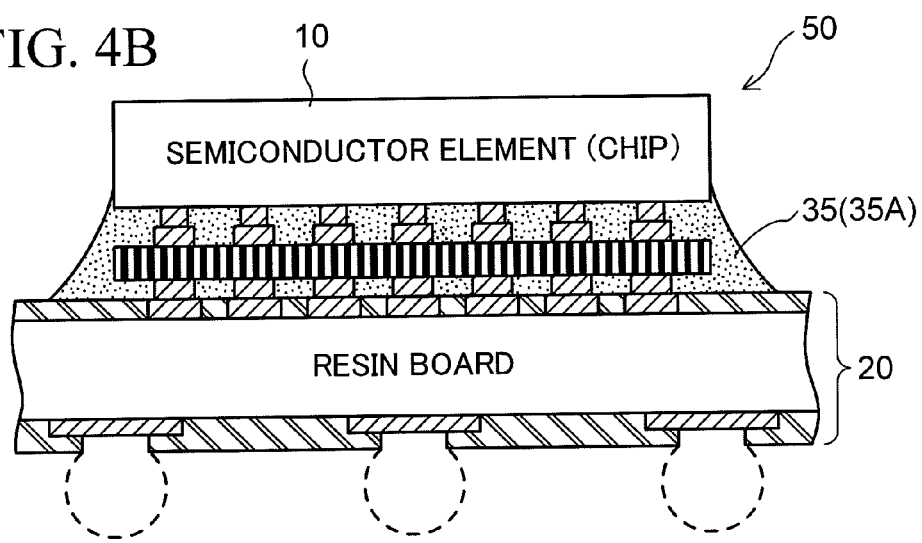

A method of manufacturing the electronic component mounted structure (semiconductor device) 50 according to this embodiment is described below with reference to FIGS. 2A to 4B. FIGS. 2A to 3B show steps of manufacturing the board for interposer 30 used in the electronic component mounted structure 50 in FIG. 1. FIGS. 4A and 4B show steps in which the semiconductor element (chip) 10 is mounted on the wiring board (package) 20 using the board for interposer 30.

First, in the first step (see FIG. 2A), an alumina (aluminum oxide) green sheet (having a thickness of approximately 70 to 100 μm and a size of approximately 10×10 mm) is prepared as the insulating base material 31. A large number of through-holes TH are formed in the entire sheet in a thickness direction thereof with a puncher or the like. Specifically, since the vias 32 are to be filled in the through-holes TH, the through-holes TH are formed densely so as to satisfy the above-described predetermined relationship: D (distance between the vias 32)<d (the diameter of the via 32).

In this embodiment, the metal filling density in the insulating base material 31 is intended to be high as described above. For this reason, it is desirable to make the diameter (d) of the via 32 as small as possible (preferably, approximately 30 nm to 1 μm). Such a hole (through-hole TH) having a small diameter can be formed by an anodic oxidation method.

For example, prepared is an aluminum (Al) substrate having a surface with an insulation coating or a glass substrate having an aluminum (Al) electrode layer formed thereon by sputtering or the like. After the surface of the Al substrate (Al electrode layer) is washed, the substrate is immersed into an electrolyte (preferably, an aqueous solution of sulfuric acid). Using the Al substrate (Al electrode layer) as an anode and using a platinum (Pt) electrode disposed on the side opposite to the Al substrate as a cathode, a current is conducted through (a pulse voltage is applied to) the electrolyte. Thereby, a porous metal oxide film (aluminum oxide film having holes of a small diameter arranged orderly) can be formed on the surface of the Al substrate (Al electrode layer). Then, a voltage of a reverse potential to that of the anodic oxidation is applied to each of the electrodes (a current is conducted using the Al substrate (Al electrode layer) as the cathode and using the Pt electrode as the anode). Thereby, the porous metal oxide film is separated from the Al substrate (Al electrode layer). Thus, obtained is the insulating base material (alumina) 31 in which the through-holes TH each having a desired small diameter (approximately 30 nm to 1 μm) are formed densely.

Incidentally, mullite, aluminum nitride, a glass-ceramic (a composite material of a glass and a ceramic), or the like may be used as the material of the insulating base material 31 instead of alumina (aluminum oxide). Furthermore, it is needless to say that the material of the insulating base material 31 is not limited to such ceramics (inorganic materials). An organic material such as a resin can be used.

When an organic resin (such as an epoxy resin or a polyimide resin) is used, however, it is desirable that an inorganic filler such as silica be densely mixed with the organic resin. Since a similar resin (the resin board 21) is used in the package 20 and has a coefficient of thermal expansion (CTE) approximate to that of the board for interposer 30 (insulating base material 31), the resin used in the board for interposer 30 surely needs to have a CTE lowered to be intermediate between those of the chip 10 and the package 20. In this case, the through-holes TH provided in the insulating base material 31 are formed by a perforating process using a carbon dioxide laser, excimer laser, or the like.

In the next step (see FIG. 2B), the vias (filamentous conductors) 32 are formed by filling a metal material in the through-holes TH formed in the insulating base material 31. For example, a metal material (such as Ag or Cu) is filled in the through-holes TH by a screen printing method, an ink-jet method, or the like, using a conductive paste such as silver (Ag) and copper (Cu).

When the organic resin (such as an epoxy resin) is used as the insulating base material 31, the metal material (such as Cu or Ni) is filled in the through-holes TH by a plating method. For example, when Cu is used as the metal material, a seed layer is formed on the surface of the insulating base material 31 (inclusive of the inner wall surfaces of the through-holes TH) by Cu electroless plating. By Cu electroplating using this seed layer as a power supply layer, the conductor (Cu) is filled in the through-holes TH. Instead, merely the use of Cu electroless plating method may be adopted to fill the through-holes TH. As an alternative method, the metal material such as Cu can be filled in the through-holes TH by a screen printing method or the like.

Furthermore, both of the surfaces of the resultant insulating base material 31 are polished and planarized as needed by mechanical polishing, chemical mechanical polishing (CMP), or the like. Thus, both ends of each via 32 are exposed from the respective surfaces of the insulating base material 31. Thereby, a structure is formed in which the vias 32 each having a small diameter are densely provided in the insulating base material 31 and penetrate the insulating base material 31 in the thickness direction thereof as illustrated.

In the next step (see FIG. 2C), seed layers SD are formed on the respective surfaces of the structure by sputtering, electroless plating, or the like. The seed layers SD are used as power supply layers when electroplating is performed in a later step. For example, titanium (Ti) conductor layers are formed on the surfaces of the base material 31 by sputtering to a thickness of approximately 0.1 μm (Ti layers), and copper (Cu) conductor layers are further added on the resulting surfaces by sputtering to a thickness of approximately 0.5 μm (Cu layers). Thus, formed are the seed layers SD each having a two-layer structure (Ti/Cu). The Ti layer, which is the lower layer of each seed layer SD, is a metal layer for enhancing the adhesion between the insulating base material 31 (the lower layer) and the Cu layer (the upper layer). Instead of Ti, chromium (Cr) may be used as the metal material.

In the next step (see FIG. 2D), by using a patterning material, plating resists are formed on the seed layers SD on the respective surfaces of the base material 31, and are opened at desired positions (formation of resist layers PR including openings OP). Each of the openings OP are being patterned so as to follow the shapes of the pads 33 and 34 formed on the respective surfaces of the base material 31 in the next step, the pads 33 being positioned at the positions opposite to those of the corresponding pads 34. As the patterning material, a photosensitive dry film (a film having a structure including a resist material interposed between a polyester cover sheet and a polyethylene separator sheet) or a liquid photoresist (for example, a liquid resist such as a novolac resin or an epoxy resin) can be used.

For example, when a dry film is used, the surface of each of the seed layers SD on the respective surfaces of the base material 31 is washed, and then a dry film (from which a separator sheet is separated) is laminated on the washed surface by thermocompression bonding. The dry film is cured by being exposed to ultraviolet (UV) radiation using a mask (unillustrated) which has been patterned into a desired shape for the pads 33 or 34. Subsequently, after the cover sheet is separated, the cured portion is etched (formation of openings OP) using a predetermined developer (a developer containing an organic solvent for a negative resist, an alkaline developer for a positive resist). Thus, a desired resist layer PR is formed. Similarly, when a liquid photoresist is used, a resist layer PR patterned in a desired shape can be formed through the processes of surface washing, resist application on the surface, drying, exposure, and development in this sequence.

In the next step (see FIG. 2E), the pads 33 and 34 as desired are formed on the respective seed layers SD exposed from the openings OP (FIG. 2D) of the resist layers PR thus patterned on the surfaces of the base material 31 by electroplating using the seed layers SD as power supply layers.

In this embodiment, a Cu layer is formed on each of the seed layers SD by copper (Cu) electroplating to a thickness of approximately 5 μm. Next, a Ni layer is formed on the Cu layer by nickel (Ni) electroplating in a thickness of approximately 5 μm. Then, an Au layer is formed on the Ni layer by gold (Au) flash plating in a thickness of approximately 1 μm. Thus, formed are the pads 33 and 34 each having a three-layer structure (Cu/Ni/Au). Here, the Ni layer is formed to enhance the adhesion between the Cu layer and the Au layer, and to prevent Cu from diffusing into the Au layer. The uppermost Au layer is formed to improve the contact bonding properties when the terminal 11 of the chip 10 and the terminal (pad) 22P of the wiring board 20 are respectively bonded to the pads 33 and 34 eventually. Moreover, the Au layer in cooperation with the Ni layer functions as a barrier layer for preventing Cu of the pads 33 and 34 from being etched when the eventually-exposed seed layer (Ti (Cr)/Cu) SD is etched.

In the next step (see FIG. 3A), the resist layers PR used as the plating resists are removed. For example, when the dry film is used as the plating resist, the resist layers PR can be removed using an alkaline chemical solution such as sodium hydroxide, monoethanolamine or the like. When the liquid resist such as a novolac resin or an epoxy resin is used, the resist layers PR can be removed using acetone, alcohol, or the like. Thus, portions of the seed layers SD covered with the resist layers PR (see FIG. 2E) are exposed.

Furthermore, the seed layers (Ti (Cr)/Cu) SD thus exposed are selectively removed from the pads 33 and 34. Specifically, using the pads (Cu/Ni/Au) 33 and 34 as masks, first, wet etching using a soluble chemical solution is performed only on Cu, and then wet etching using a soluble chemical solution is performed only on Ti (Cr). In this manner, only the exposed seed layers SD can be selectively etched. Thereafter, a predetermined surface washing is performed.

Thus, as illustrated, a pad 33 (or 34) is insulated from the adjacent pads 33 (or 34), and a structure is formed in which the pads 33 and 34 are disposed on (connected to) the respective surfaces of the base material 31 in such a manner that the pair of pads 33 and 34 share the plurality of filamentous conductors (vias) 32 formed to penetrate the insulating base material 31. Note that, in the example of FIG. 3A, the illustration of portions of the seed layers SD (see FIG. 2E) left immediately under the pads 33 and 34 is omitted.

In the next step (see FIG. 3B), (uncured) adhesive layers 35A used as underfill materials are deposited to both surfaces of the structure (except for the portions corresponding to the pads 33 and 34). As the adhesive layer 35A, a shrinkable resin is used, and preferably a thermosetting epoxy resin is used.

By the above steps, formed is a structure in which the pads 33 and 34 disposed on the respective surfaces of the insulating base material 31 are electrically connected to each other through the plurality of vias 32 penetrating the insulating base material 31, and in which the adhesive layers 35A are formed on the portions between the adjacent pads 33 (or 34) on the base material 31. Namely, the board for interposer 30 is manufactured.

In the next step (see FIG. 4A), prepared are the semiconductor element (chip) 10 and the wiring board (package) 20 which are to be electrically connected and mechanically bonded to each other with the board for interposer 30 interposed therebetween. Then, these members are aligned.

(Preparation of Semiconductor Chip 10)

The chip 10 to be mounted can be manufactured as follows, for example.

First, a desired device processing is performed on one surface of a silicon (Si) wafer having a desired size (diameter of 8 inches or 12 inches) to fabricate a plurality of devices in an array pattern. A passivation film 12 (see an enlarged view of a portion surrounded by a broken line in FIG. 4A) is formed on the surface where the devices are formed. The passivation film 12 is made of silicon nitride (SiN), phosphosilicate glass (PSG), or the like. The passivation film 12 is removed at a portion corresponding to an electrode pad 13 defined at a portion of an aluminum (Al) wiring layer patterned on each device (namely, the portion of the passivation film 12 is opened to expose the electrode pad 13 therefrom).

Next, on the passivation film 12, an insulating film (not shown) such as a polyimide resin is formed as needed. Then, by sputtering or the like in the same manner as performed in the step of FIG. 2C, a seed layer 14 having a two-layer structure (Ti (Cr)/Cu) is formed on the entire surface where the insulating film is formed. Subsequently, in the same manner performed in the step of FIG. 2D, a plating resist layer (not shown) is formed on the seed layer 14. The plating resist layer is patterned to have an opening corresponding to the shape and arrangement of the bump (projecting terminal 11) to be formed.

Thereafter, while utilizing the seed layer 14, Cu electroplating is performed on the seed layer 14 (the electrode pads 13) exposed from the opening of the resist layer. Thereby, the projecting terminal (Cu bump) 11 as desired is formed. After that, the back surface (the surface opposite to the surface where the devices are formed) of the wafer is ground with an appropriate grinder so as to thin the wafer to a predetermined thickness. Then, in the same manner performed in the step of FIG. 3A, the plating resist layer is removed, and the seed layer 14 thus exposed is selectively etched. Subsequently, a predetermined surface washing or the like is performed, and the wafer is divided (diced) into device units.

Thus, manufactured is the semiconductor chip 10 having a structure including the device formation surface covered with the passivation film 12 and the projecting terminals (bumps) 11 arranged in an area array pattern as illustrated.

(Preparation of Wiring Board 20)

As described above, any board may constitute the resin board 21 which is the body of the wiring board 20, as long as the board includes wiring layers formed at least on the outermost layers of the board, the wiring layers being electrically connected to each other through the inside of the board.

Where wiring layers are formed within the resin board 21, for example, a wiring board of a multilayer structure formed by a build-up process can be utilized. The typical manufacturing process thereof involves building up layers by sequentially repeating formation of an insulating layer (epoxy resin), formation of a via hole in the insulating layer, and formation of a wiring layer (Cu) inclusive of the inside of the via hole, on both surfaces of a core substrate used as a base material. The outermost wiring layers 22 and 23 thus formed through the above process are electrically connected to each other through the wiring layers appropriately formed at desired positions within the board, and through the via holes (conductors filled therein) through which the wiring layers are interconnected.

Alternatively, where no wiring layer is formed within the resin board 21, the outermost wiring layers 22 and 23 are electrically connected to each other via through-holes (conductors filled therein) appropriately formed at desired positions of the resin board 21.

To the pads 22P and 23P defined at desired positions of the outermost wiring layers 22 and 23, the pads 34 formed on the board for interposer 30 and the external connection terminals (such as the solder balls 26 shown by broken lines in the drawing) are bonded, respectively. For this reason, it is desirable to perform Ni plating and Au plating in this order on the wiring layers (Cu) 22 and 23. This is intended to improve the contact bonding properties when the external connection terminals or the like are bonded to the pads 23P, to enhance the adhesion between the Au layer and the Cu layer constituting the pads 22P and 23P, and to prevent Cu from diffusing into the Au layer.

Furthermore, the solder resist layers 24 and 25 functioning as protection films are formed on the respective surfaces of the resin board 21. For example, the resin board 21 and the wiring layers 22 and 23 are coated with a photosensitive epoxy resin, and the resin layer thus coated is patterned into a desired shape (from which portions corresponding to the pads 22P and 23P are exposed) to thereby form the solder resist layers 24 and 25.

Thus, manufactured is the wiring board (package) 20 including the wiring layers 22 and 23 patterned into desired shapes on the respective surface of the resin board 21 as well as the solder resist layers 24 and 25 formed to cover the respective surfaces and to expose the pads 22P and 23P defined at desired positions of the wiring layers 22 and 23 as illustrated.

The members thus prepared (the wiring board 20, the board for interposer 30, the chip 10) are aligned with one another as shown in FIG. 4A. Specifically, the members 20, 30, and 10 are aligned in such a manner that the pads 34 on the board for interposer 30 are positioned above the corresponding terminals (pads) 22P on the chip mounting surface side of the wiring board 20, and that the terminals 11 of the chip 10 are positioned above the corresponding pads 33 on the opposite side of the board for interposer 30.

In the next step (see FIG. 4B), the members thus aligned (the wiring board 20, the board for interposer 30, the chip 10) are superposed on one another, and placed between a pair of hot press plates (not shown). Then, the members are heated and pressed from both of the upper and lower surfaces by vacuum press or the like into laminated layers to form an integrated structure.

By the heating and pressing treatment, the uncured adhesive layers 35A (thermosetting epoxy resin) formed on the respective surfaces of the board for interposer 30 are melted, and the melted resin is filled as the underfill resin 35 into the space between the chip 10 and the wiring board 20 as illustrated. Then, the resin 35 is cured to ensure the mechanical bonding of the board for interposer 30 to the chip 10 and to the wiring board 20.

Moreover, in the course of the heating and pressing treatment, the terminals 11 of the chip 10 and the terminals 22P of the wiring board 20 are pressure-bonded (brought into contact with) and electrically connected to the corresponding pads 33 and 34 on the board for interposer 30 (flip chip mounting). During this process, the terminals 11 and 22P are fixed to the respective pads 33 and 34 in the contact state because of the volume shrinkability of the thermally cured underfill resin 35. Thus, the electrical connection of the board for interposer 30 to the chip 10 and to the wiring board 20 is kept stabilized.

By the above steps, the semiconductor device (electronic component mounted structure) 50 shown in FIG. 1 is manufactured.

As has been described, in the electronic component mounted structure (semiconductor device) 50 according to the present embodiment, the board for interposer 30 is interposed between the semiconductor chip 10 as the electronic component and the wiring board (package) 20. The filamentous conductors (vias) 32 each having a small diameter are densely provided in the insulating base material 31 of the board 30, penetrating the insulating base material 31 in the thickness direction thereof. The pads 33 and 34 are disposed on (connected to) the respective surfaces of the base material 31 in such a manner that the pair of pads 33 and 34 share the plurality of vias 32. Moreover, the terminals 11 of the chip 10 are electrically connected to the corresponding terminals (pads) 22P on the package 20 via the pads 33 and 34 (the plurality of vias 32).

Namely, the terminals 11 of the chip 10 and the corresponding terminals 22P on the package 20 are connected to each other without using solder (solder bumps), which is one of low-melting-point metals and readily causes electromigration as in the conventional structure. Instead, the terminals 11 and the corresponding terminals 22P are connected to each other with the plurality of vias 32 (and the pads 33 and 34) interposed therebetween. Thereby, at the time of use (at the time of conducting a current) after the chip is mounted, problems such as encountered in the prior art (an open circuit, an increase in the electrical resistance or the like, due to electromigration at the connection portion between the chip and the board) can be substantially eliminated. Consequently, the reliability of connection between the chip 10 and the wiring board (package) 20 is increased.

Moreover, a material having a coefficient of thermal expansion (CTE) intermediate between those of the chip 10 and the package 20 is selected as the material for the board for interposer 30 (particularly, the insulating base material 31) interposed between the chip 10 and the package 20. Accordingly, even when a stress (thermal stress) attributable to the difference in CTE between the chip 10 and the package 20 is generated at the time of use after the chip mounting (at the time of conducting a current), the board for interposer 30 effectively absorbs (relaxes) the generated thermal stress (which may warp the package). This contributes to an improvement in the reliability of connection between the chip 10 and the package 20.

<Other Embodiments ... see FIGS. 5 to 8>

Figure 5:
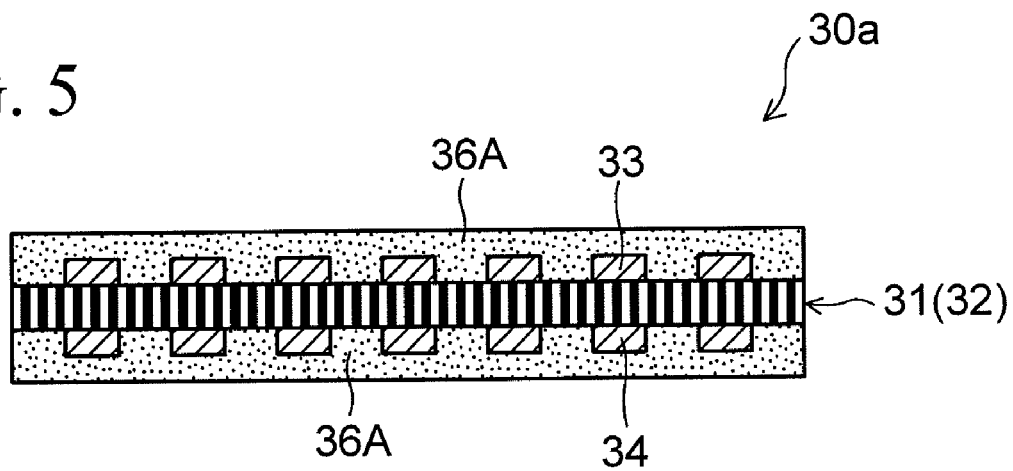
FIG. 5 is a sectional view showing the configuration of a board for interposer according to a first modified example of the board for interposer used in the electronic component mounted structure in FIG. 1.

FIG. 5 shows the configuration (sectional view) of a board for interposer 30a according to a first modified example of the board for interposer 30 used in the above-described embodiment (FIGS. 1 to 4B).

The board for interposer 30a of this embodiment is different in configuration from the board for interposer 30 of the above-described embodiment (see FIG. 3B). Specifically, the pads 33 and 34 are disposed on the respective surfaces of the insulating base material 31, and electrically connected to each other through the plurality of vias 32 penetrating the insulating base material 31. In addition, adhesive layers 36A are formed on both of the surfaces of the base material 31 so as to cover the pads 33 and 34, respectively. Since other structural components are the same as those in the above-described embodiment, description thereof is omitted.

The adhesive layers 36A are each made of a shrinkable resin (thermosetting epoxy resin) as in the case of the adhesive layer 35A in the above-described embodiment, and formed in an uncured state. When the chip 10 is mounted on the wiring board (package) 20 with the board for interposer 30a interposed therebetween (see FIG. 4B), the uncured adhesive layers 36A are melted in the course of the heating and pressing treatment. At this time, the terminals 11 of the chip 10 and the terminals 22P of the wiring board 20 protrude from the melted resin and come into contact with and electrically connected to the corresponding pads 33 and 34 on the board for interposer 30a (flip chip mounting). Moreover, the melted resin (adhesive layers 36A) is filled as the underfill resin 35 into the space between the chip 10 and the wiring board 20.

Thus the same electronic component (chip 10) mounted structure (semiconductor device) 50 as in the above-described embodiment is manufactured. In this embodiment as well, the same function and advantageous effects as those of the above-described embodiment can be achieved.

Figure 6:
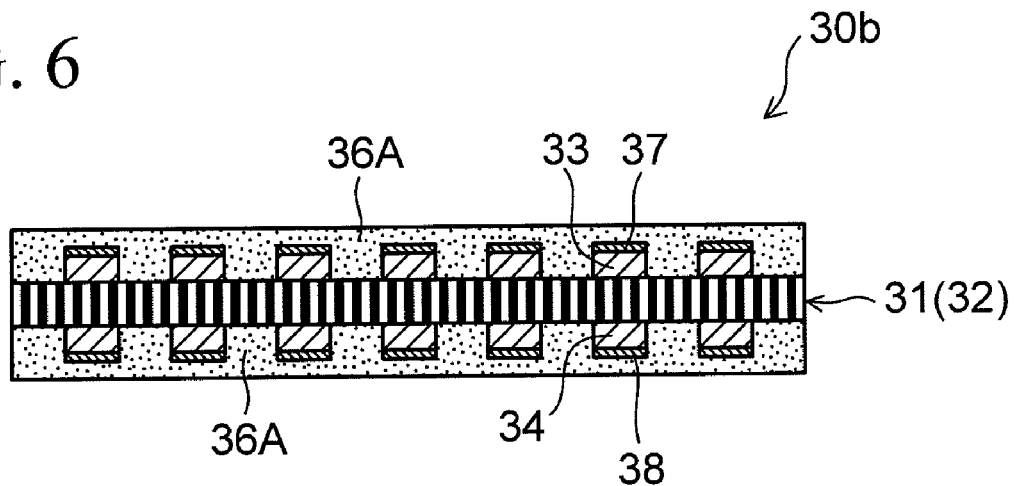
FIG. 6 is a sectional view showing the configuration of a board for interposer according to a second modified example of the board for interposer used in the electronic component mounted structure in FIG. 1.

FIG. 6 shows the configuration (sectional view) of a board for interposer 30b according to a second modified example of the board for interposer 30 used in the above-described embodiment (FIGS. 1 to 4B).

The board for interposer 30b of this embodiment is different in configuration from the board for interposer 30a according to the first modified example (FIG. 5). Specifically, conductor layers 37 and 38 (low-melting-point metal) are formed on the surfaces of the respective pads 33 and 34 formed on the surfaces of the insulating base material 31. Since other structural components are the same as those in the first modified example, description thereof is omitted.

The conductor layers 37 and 38 (low-melting-point metal) formed on the surfaces of the respective pads 33 and 34 are formed of a metal material which is melted in the course of the heating and pressing treatment when the chip 10 is mounted on the wiring board (package) 20 with the board for interposer 30b interposed therebetween (see FIG. 4B). As materials for the low-melting-point metal, there are preferably used, for example, tin (Sn) having a melting point of 300° C. or lower, solder (such as Sn—Pb, Sn—Ag, or Sn—Ag—Cu) containing Sn as the main component, or the like. Note, since Sn or an alloy thereof readily causes electromigration, the amount to be used is desirably as small as possible.

In the above-described embodiments (FIGS. 4B and 5), the electrical connection of the board for interposer 30 to the chip 10 and to the wiring board 20 is achieved through the contact of the terminals 11 of the chip 10 and the terminals (pads) 22P of the wiring board 20 with the corresponding pads 33 and 34 on the board for interposer 30. In this embodiment (FIG. 6), the terminals 11 of the chip 10 and the terminals 22P of the wiring board 20 are fixedly connected to the corresponding pads 33 and 34 on the board for interposer 30b with the conductor layers 37 and 38 (low-melting-point metal) interposed therebetween.

Specifically, the low-melting-point metal (Sn or an alloy thereof) is melted and hardened in the course of the heating and pressing treatment when the chip 10 is mounted on the wiring board 20 with the board for interposer 30b interposed therebetween (see FIG. 4B). Thereby, the terminals 11 and 22P are mechanically fixed to the corresponding pads 33 and 34 with the respective conductor layers 37 and 38 (the hardened low-melting-point metal) interposed therebetween. Accordingly, the chip 10 and the wiring board 20 are more surely and electrically connected to the board for interposer 30b. Thus, the electrical resistances at the connection portions are stabilized at the time of use after the mounting (at the time of conducting a current). This contributes to an improvement in the reliability of connection.

Figure 7A:
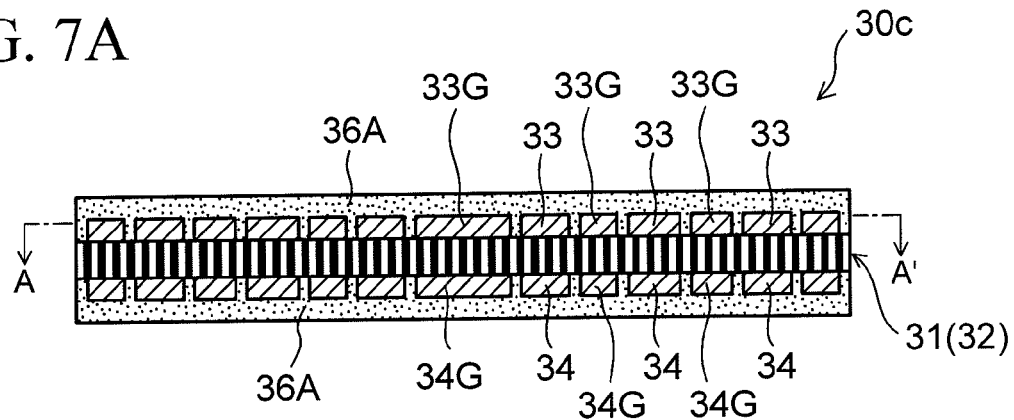
FIGS. 7A and 7B are views showing the configuration of a board for interposer according to a third modified example of the board for interposer used in the electronic component mounted structure in FIG. 1, FIG. 7A being a sectional view of the board, and FIG. 7B being a (partial) plan view thereof seen along the line A-A' in FIG. 7A.
Figure 7B:
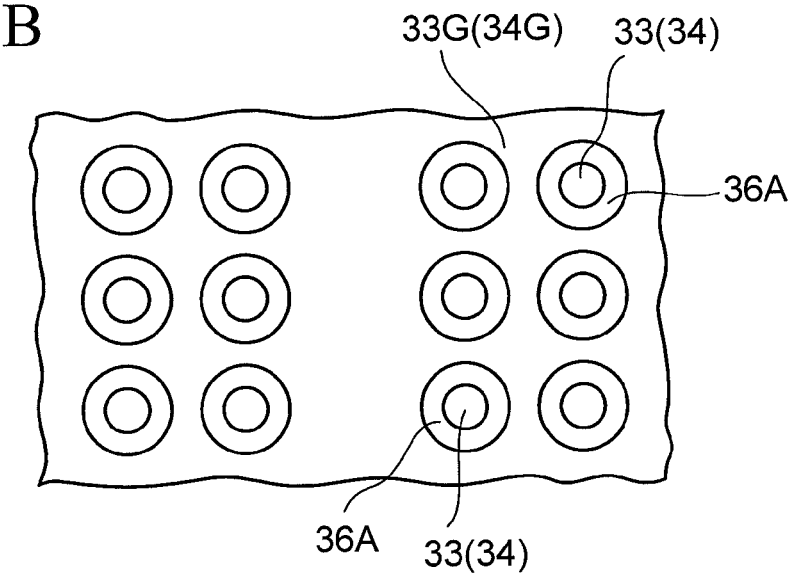

FIGS. 7A and 7B show the configuration of a board for interposer 30c according to a third modified example of the board for interposer 30 used in the above-described embodiment (FIG. 1 to FIG. 4B). FIG. 7A shows a sectional view of the board for interposer 30c. FIG. 7B shows a (partial) plan view thereof seen along the line A-A' in FIG. 7A.

The board for interposer 30c of this embodiment is different in configuration from the board for interposer 30a according to the first modified example (FIG. 5). Specifically, each of the pair of pads 33 and 34 disposed on the respective surfaces of the insulating base material 31 is surrounded by a corresponding conductor layer (ground layer) 33G, 34G with a predetermined distance around the pad. The ground layers 33G and 34G are connected to the ground. Since other structural components are the same as those in the first modified example, description thereof is omitted.

The ground layers 33G and 34G formed to surround the corresponding pads 33 and 34 are disposed on the respective surfaces of the insulating base material 31 and share the plurality of vias 32 provided in the base material 31, in the same manner as the pads 33 and 34. The distance between each of the pads 33 and 34 and the corresponding ground layers 33G and 34G is selected to be larger than the diameter of the via 32 as in the case of the above-described distance between the pads 33 (or 34). This is because the metal filling density is made high as described above (i.e., because the vias 32 are densely arranged).

This embodiment has the following merits in addition to the effects obtained in the above-described embodiments. Namely, since this configuration has a structure equivalent to that of a coaxial line, a shielding (blocking) effect is obtained. Moreover, the ground layers 33G and 34G are formed to surround the corresponding pads 33 and 34; therefore, when the pads are used as signal terminals, electrical coupling (capacitive coupling) between the signal terminals (pads 33 or 34) adjacent to each other is reduced. Thus the structure prevents the signal terminal itself from acting as a noise source.

Figure 8:
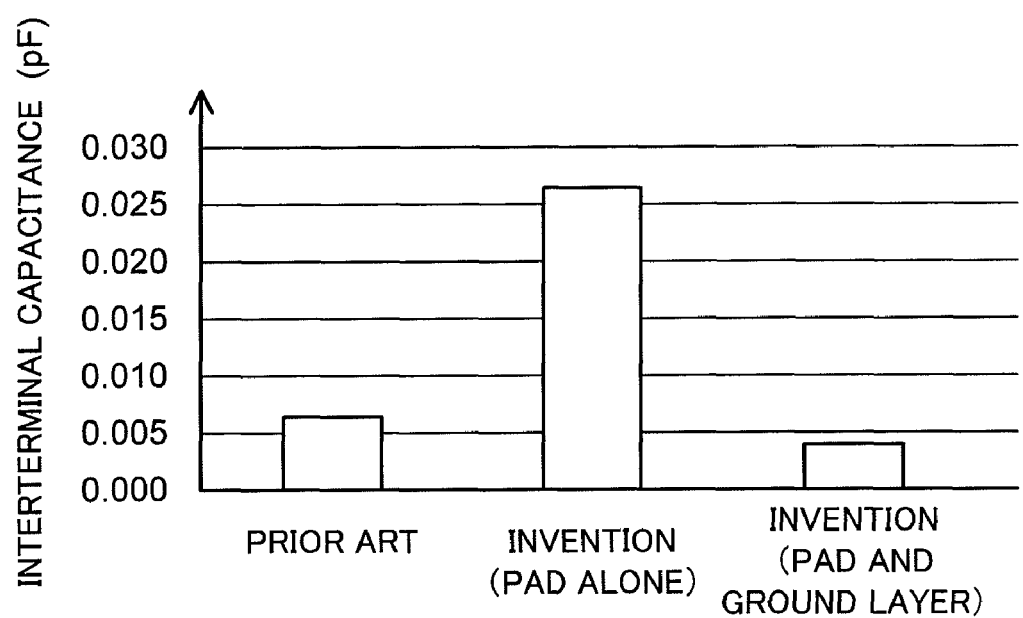
FIG. 8 is a view for explaining an effect of the board for interposer in FIGS. 7A and 7B.

FIG. 8 shows one example of this effect. In FIG. 8, the interterminal capacitance of the "prior art" indicates the capacitance of the adjacent terminals (pads) provided on the package. The interterminal capacitance of the "invention (pad alone)" indicates the capacitance of the adjacent terminals (pads) 22P on the package. The interterminal capacitance of the "invention (pad and ground layer)" indicates the capacitance of the adjacent terminals (pads) 22P on the package 20 when the board for interposer 30c of this embodiment (FIGS. 7A and 7B) is used. As seen from the illustrated graph, the interterminal capacitance in this embodiment is reduced in comparison with that of the prior art.

What is claimed is:

1. An electronic component mounted structure comprising:
   an electronic component having a terminal;
   a wiring board having a terminal electrically connected to the terminal of the electronic component; and
   an interposing board disposed between the electronic component and the wiring board and having a structure including an insulating base material provided with a large number of filamentous conductors penetrating the insulating base material in a thickness direction thereof,
   wherein the terminal of the electronic component is electrically connected to the terminal of the wiring board via a plurality of filamentous conductors in the interposing board,
   wherein a pair of pads each made of a conductor layer are respectively formed on both surfaces of the insulating base material in such a manner that the pads share the plurality of filamentous conductors, and wherein one of the pads is connected to the terminal of the electronic component, and another pad is connected to the terminal of the wiring board, and wherein a coefficient of thermal expansion of the interposing board is selected to be higher than a coefficient of thermal expansion of the electronic component, and to be lower than a coefficient of thermal expansion of the wiring board.

2. The electronic component mounted structure according to claim 1, wherein each of the pair of pads is surrounded by a conductor layer with a predetermined distance around the pad, the conductor layer being connected to the ground.

3. The electronic component mounted structure according to claim 1, wherein a shrinkable resin is filled in a space between the electronic component and the interposing board, and a space between the wiring board and the interposing board.

4. The electronic component mounted structure according to claim 3, wherein the resin is mixed with an inorganic filler.

5. The electronic component mounted structure according to claim 1, wherein a conductor layer made of a metal having a low melting point is formed on a surface of each of the pair of pads.

6. The electronic component mounted structure according to claim 1, wherein when a plurality of the pair of pads are formed on the respective surfaces of the insulating base material, the plurality of the pads on each surface are disposed in such a manner that a distance between pads adjacent to each other is larger than a diameter of the filamentous conductor.

7. The electronic component mounted structure according to claim 1, wherein the large number of filamentous conductors in the insulating base material are disposed in such a manner that a distance between filamentous conductors adjacent to each other is smaller than a diameter of the filamentous conductor.

8. The electronic component mounted structure according to claim 1, wherein the large number of filamentous conductors in the insulating base material include a filamentous conductor not connected to and thus isolated from any of the pads.

* * * * *